(12) United States Patent
Takematsu et al.

(10) Patent No.: US 12,531,544 B2
(45) Date of Patent: Jan. 20, 2026

(54) RADIO FREQUENCY MODULE

(71) Applicant: Murata Manufacturing Co., Ltd., Kyoto (JP)

(72) Inventors: Yuji Takematsu, Kyoto (JP); Tetsuro Harada, Kyoto (JP); Hiroaki Takaoka, Kyoto (JP); Hiroki Deguchi, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 353 days.

(21) Appl. No.: 18/333,653

(22) Filed: Jun. 13, 2023

(65) Prior Publication Data

US 2024/0039515 A1 Feb. 1, 2024

(30) Foreign Application Priority Data

Jul. 27, 2022 (JP) ................................. 2022-119868

(51) Int. Cl.
 *H03H 9/64* (2006.01)
 *H04B 1/04* (2006.01)

(52) U.S. Cl.
 CPC ............ *H03H 9/6423* (2013.01); *H04B 1/04* (2013.01)

(58) Field of Classification Search
 CPC .... H03H 9/6423; H03H 9/0547; H03H 9/059; H03H 9/1085; H03H 3/08; H03H 9/6483; H04B 1/04
 See application file for complete search history.

(56) References Cited

U.S. PATENT DOCUMENTS

| | | | | |
|---|---|---|---|---|
| 8,508,316 | B2* | 8/2013 | Link .................... | H03H 9/605 333/187 |
| 10,193,527 | B2* | 1/2019 | Tsukamoto ............ | H03H 9/542 |
| 10,263,600 | B2* | 4/2019 | Tsukamoto ............ | H03H 9/703 |
| 2002/0180562 | A1* | 12/2002 | Taniguchi ............. | H03H 9/6433 333/193 |
| 2012/0181898 | A1* | 7/2012 | Hatakeyama ........... | H03H 3/08 310/313 B |
| 2014/0218129 | A1* | 8/2014 | Fujiwara ............... | H03H 9/70 333/195 |
| 2018/0242455 | A1* | 8/2018 | Kuhlman ............... | H01L 25/16 |
| 2021/0143793 | A1* | 5/2021 | Shirakawa ............. | H03H 9/0557 |
| 2023/0179171 | A1* | 6/2023 | Yasuda ................. | H03H 9/6483 333/193 |
| 2023/0238984 | A1* | 7/2023 | Tajima ................. | H03H 9/6433 333/186 |
| 2024/0088872 | A1* | 3/2024 | Noguchi ............... | H03H 9/70 |
| 2024/0178816 | A1* | 5/2024 | Xu ...................... | H03H 9/02125 |
| 2024/0212890 | A1* | 6/2024 | Shinoura ............... | H01C 7/00 |

(Continued)

*Primary Examiner* — Santiago Garcia
(74) *Attorney, Agent, or Firm* — McDonald Hopkins LLC

(57) ABSTRACT

A radio frequency module includes a module substrate, a plurality of passive components disposed on a main surface of the module substrate, and a filter component disposed over the plurality of passive components, wherein the filter component includes series arm resonators that constitute an acoustic wave filter, the series arm resonator is connected between the series arm resonators, and a region of the filter component formed with the series arm resonator does not overlap the plurality of passive components and at least a part of the other region of the filter component overlaps at least a part of each of the plurality of passive components in a plan view of the module substrate.

15 Claims, 6 Drawing Sheets

(56) References Cited

U.S. PATENT DOCUMENTS

| | | | |
|---|---|---|---|
| 2024/0317579 A1* | 9/2024 | Kaminishi | B81B 7/0006 |
| 2024/0344950 A1* | 10/2024 | Onda | G01N 33/0031 |
| 2025/0096771 A1* | 3/2025 | Takata | H03H 9/145 |
| 2025/0105822 A1* | 3/2025 | Kasamatsu | H03H 9/25 |

* cited by examiner

RADIO FREQUENCY MODULE

CROSS REFERENCE TO RELATED APPLICATION

This application claims priority from Japanese Patent Application No. 2022-119868 filed on Jul. 27, 2022. The content of this application is incorporated herein by reference in its entirety.

BACKGROUND ART

The present disclosure relates to a radio frequency module.

In mobile communication devices such as mobile phones, radio frequency front end modules have become more complicated particularly with the development of multi-band technology. U.S. Patent Application Publication No. 2018/0242455 discloses a technique for miniaturizing a radio frequency module by disposing an active element on two passive components.

However, in the technique described above in the past, there is a case where characteristics of the element disposed on the two passive components are deteriorated.

BRIEF SUMMARY

The present disclosure provides a radio frequency module capable of suppressing deterioration of characteristics.

A radio frequency module according to an aspect of the present disclosure includes a module substrate, a plurality of passive components disposed on a main surface of the module substrate, and a first filter component disposed over the plurality of passive components, wherein the first filter component includes a first series arm resonator, a second series arm resonator, and a third series arm resonator that constitute a first acoustic wave filter, the second series arm resonator is connected between the first series arm resonator and the third series arm resonator, and a region of the first filter component formed with the second series arm resonator does not overlap the plurality of passive components and at least a part of the other region of the first filter component overlaps at least a part of each of the plurality of passive components in a plan view of the module substrate.

The radio frequency module according to one aspect of the present disclosure can suppress deterioration of characteristics.

DETAILED DESCRIPTION

Figure 1:
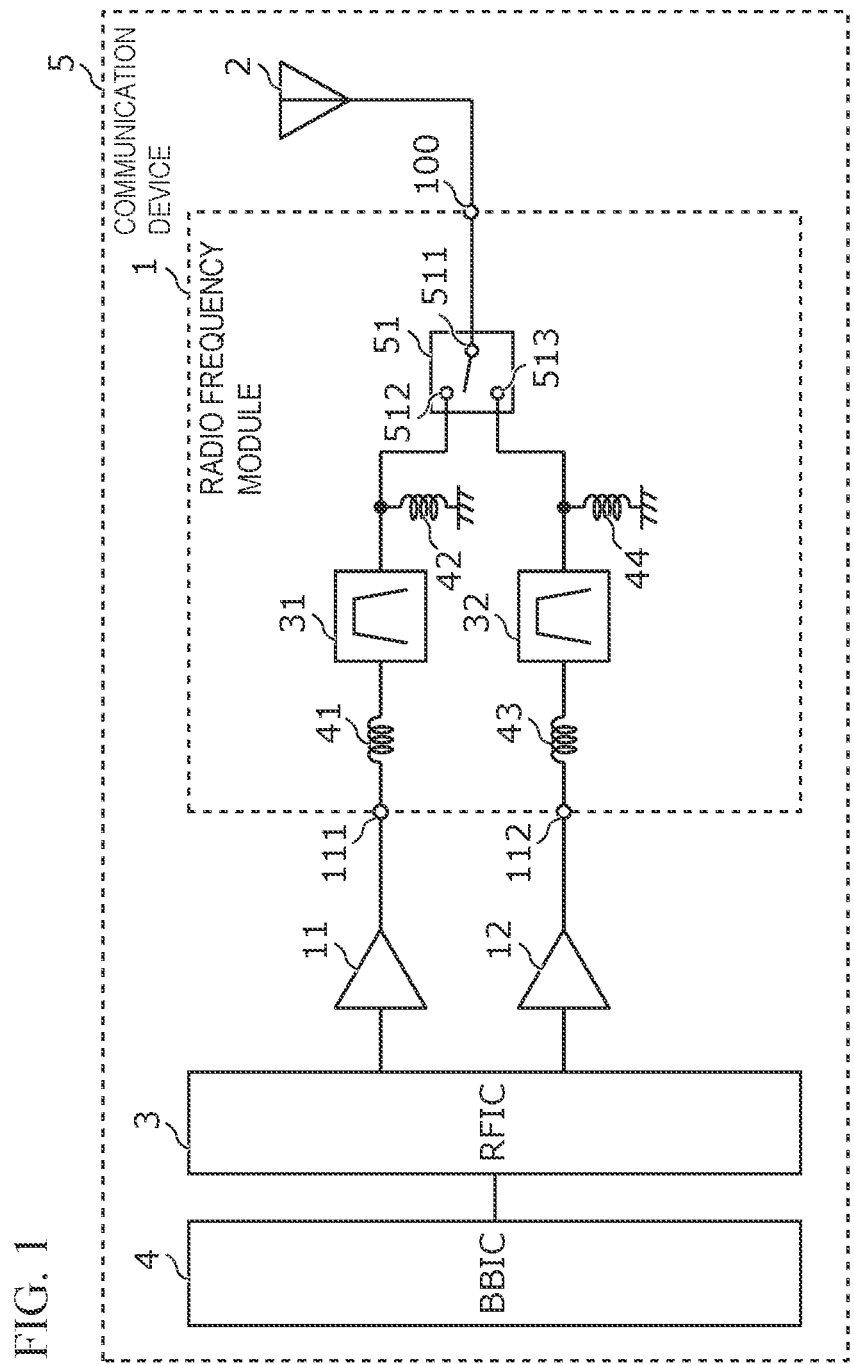
FIG. 1 is a circuit configuration diagram of a communication device according to Embodiment 1.

Hereinafter, embodiments of the present disclosure will be described in detail with reference to the drawings. Note that each of the embodiments described below indicates a comprehensive or specific example. Numerical values, shapes, materials, constituent elements, arrangement and connection formation of the constituent elements, and the like described in the following embodiments are mere examples, and are not intended to be limited to the present disclosure.

Note that the drawings are schematic diagrams in which emphasis, omission, or ratio adjustment is performed as appropriate in order to illustrate the present disclosure, and are not necessarily strictly illustrated, and may be different from actual shapes, positional relationships, and ratios. In the drawings, substantially the same configurations are denoted by the same reference signs, and redundant description may be omitted or simplified.

In each of the following drawings, an x-axis and a y-axis are axes orthogonal to each other on a plane parallel to a main surface of a module substrate. Specifically, when the module substrate has a rectangular shape in a plan view, the x-axis is parallel to a first side of the module substrate, and the y-axis is parallel to a second side orthogonal to the first side of the module substrate. In addition, the z-axis is an axis perpendicular to the main surface of the module substrate, and its positive direction indicates an upward direction and its negative direction indicates a downward direction.

In the present disclosure, a "circuit component" means a component including an active element and/or a passive element. That is, the circuit component includes an active component and a passive component, and do not include an electromechanical component (for example, a terminal, a connector, a wiring line, and the like). The "active component" means a component that includes an active element such as a transistor, a diode or the like. The "passive component" means a component that includes a passive element such as an inductor, a transformer, a capacitor, a resistor or the like. Note that the active component may include a passive element in addition to the active element.

In the circuit configuration of the present disclosure, the term "connected" includes not only a case of being directly connected by a connection terminal and/or a wiring conductor but also a case of being electrically connected via another circuit element. The expression "connected between A and B" means being connected to both A and B and being positioned between A and B, and means being connected in series to a path connecting A and B.

In the circuit configuration of the present disclosure, a "terminal" means a point at which a conductor in an element is terminated. It should be noted that when an impedance of a conductor serving as a path between elements is sufficiently low, a terminal may be interpreted as not only a single point but also any point on the path between the elements or the entire path.

In the component arrangement of the present disclosure, the expression "a component is disposed at a substrate" includes not only a case where the component is disposed on the substrate in a state of being in contact with the substrate but also a case where the component is disposed above the substrate without necessarily being in contact with the substrate (for example, a case where the component is laminated on another component disposed on the substrate)

and a case where a part or all of the component is disposed so as to be embedded in the substrate. The expression "a component is disposed on a main surface of a substrate" includes not only a case where the component is disposed on the main surface in a state of being in contact with the main surface of the substrate but also a case where the component is disposed above the main surface without necessarily being in contact with the main surface and a case where a part of the component is disposed so as to be embedded in the substrate from the main surface side. The expression "A is physically connected to B" includes not only that A is directly connected to B but also that A is indirectly connected to B, for example, that A is connected to B via C.

In addition, as for the component arrangement of the present disclosure, the expression "in a plan view" means that an object is viewed by being projected onto an xy plane along the z-axis. The expression "A overlaps B in a plan view" means that a region of A projected onto the xy plane along the z-axis overlaps a region of B projected onto the xy plane along the z-axis. The term "a region formed with a resonator" means a region occupied by a functional electrode constituting the resonator.

In addition, the terms indicating relationships between elements, such as "parallel", "perpendicular" and the like, the terms indicating shapes of elements, such as "rectangular", and numerical ranges indicate not only strict meaning but also substantially equivalent ranges, for example, a range including an error of about several percent.

Embodiment 1

A communication device 5 according to Embodiment 1 will be described below. The communication device 5 according to the present embodiment corresponds to a user terminal (User Equipment (UE)) in a cellular communication system, and is typically a mobile phone, a smartphone, a tablet computer, a wearable device, or the like. Note that the communication device 5 may be an Internet of Things (IoT) sensor device, a medical/healthcare device, a vehicle, an unmanned aerial vehicle (UAV) (a so-called drone), or an automated guided vehicle (AGV). Further, the communication device 5 may be used as a base station (BS) in a cellular communication system.

Figure 2:
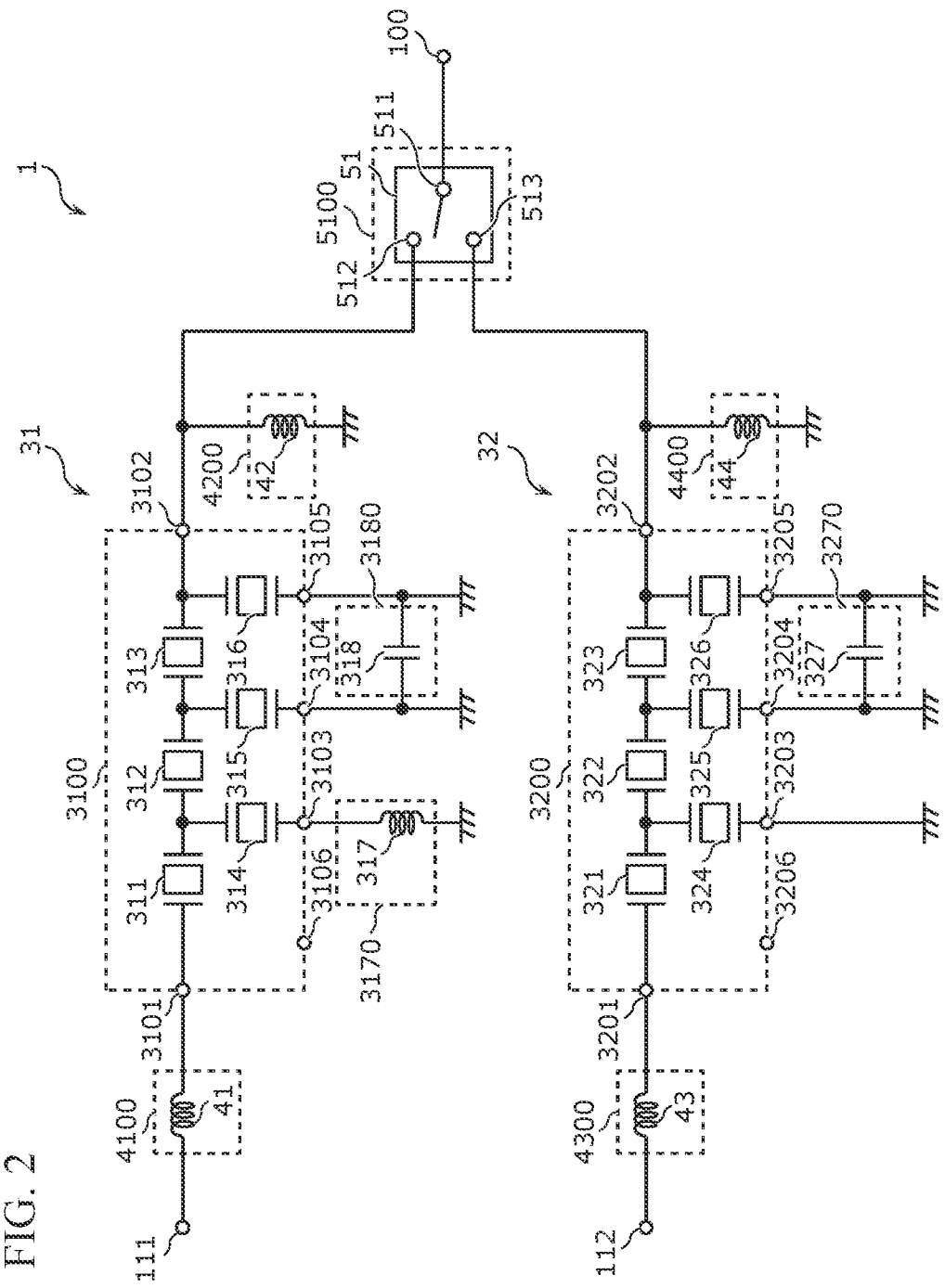
FIG. 2 is a circuit configuration diagram of a radio frequency module according to Embodiment 1.

Here, circuit configurations of the communication device 5 and a radio frequency module 1 according to the present embodiment will be described with reference to FIG. 1 and FIG. 2. FIG. 1 is a circuit configuration diagram of the communication device 5 according to the present embodiment. FIG. 2 is a circuit configuration diagram of the radio frequency module 1 according to the present embodiment.

It should be noted that FIG. 1 and FIG. 2 are exemplary circuit configurations and that the communication device 5 and the radio frequency module 1 may be implemented by using any of a wide variety of circuit implementations and circuit technologies. Thus, description of the communication device 5 and the radio frequency module 1 that will be provided below should not be interpreted in a limited manner.

1.1 Circuit Configuration of Communication Device 5

First, a circuit configuration of the communication device 5 according to the present embodiment will be described with reference to FIG. 1. The communication device 5 includes the radio frequency module 1, an antenna 2, a radio frequency integrated circuit (RFIC) 3, a baseband integrated circuit (BBIC) 4, and power amplifiers 11 and 12.

The radio frequency module 1 transmits a radio frequency signal between the antenna 2 and the RFIC 3. A circuit configuration of the radio frequency module 1 will be described later.

The antenna 2 is connected to an antenna connection terminal 100 of the radio frequency module 1. The antenna 2 can receive a radio frequency signal from the radio frequency module 1 and output the radio frequency signal to the outside of the communication device 5. In addition, the antenna 2 can also receive a radio frequency signal from the outside of the communication device 5 and transmit the radio frequency signal to the radio frequency module 1. Note that the antenna 2 does not need to be included in the communication device 5. Additionally, the communication device 5 may further include one or more antennas in addition to the antenna 2.

The RFIC 3 is an example of a signal processing circuit that processes a radio frequency signal. To be more specific, the RFIC 3 can perform signal processing of a transmission signal input from the BBIC 4 by up-conversion and the like and output the radio frequency transmission signal generated by the signal processing to the radio frequency module 1. In addition, when the radio frequency module 1 includes a reception path, the RFIC 3 may perform signal processing of a radio frequency reception signal input via the reception path by down-conversion and the like and output the reception signal generated by the signal processing to the BBIC 4. Furthermore, the RFIC 3 may include a control unit that controls a switch, an amplifier, and the like included in the radio frequency module 1. Note that some or all of the functions of the RFIC 3 as the control unit may be configured outside the RFIC 3 and may be included in, for example, the BBIC 4 or the radio frequency module 1.

The BBIC 4 is a baseband signal processing circuit that processes a signal by using an intermediate frequency band having a lower frequency than that of a radio frequency signal transmitted by the radio frequency module 1. As a signal to be processed in the BBIC 4, for example, an image signal for image display and/or an audio signal for a telephone call via a speaker is used. Note that the BBIC 4 does not need to be included in the communication device 5.

The power amplifiers 11 and 12 can amplify a radio frequency signal from the RFIC 3. Input terminals of the power amplifiers 11 and 12 are connected to the RFIC 3, and output terminals of the power amplifiers 11 and 12 are connected to the radio frequency module 1. Note that the power amplifiers 11 and 12 may be included in the radio frequency module 1.

1.2 Circuit Configuration of Radio Frequency Module 1

Next, a circuit configuration of the radio frequency module 1 according to the present embodiment will be described with reference to FIG. 1 and FIG. 2. The radio frequency module 1 includes acoustic wave filters 31 and 32, inductors 41 to 44, a switch 51, an antenna connection terminal 100, and radio frequency input terminals 111 and 112.

The acoustic wave filter 31 is an example of a first acoustic wave filter, and is connected between the antenna connection terminal 100 and the radio frequency input terminal 111. In the present embodiment, the acoustic wave filter 31 is a surface acoustic wave (SAW) filter and functions as a band pass filter having a pass band including a band A. Note that the acoustic wave filter 31 is not limited to the SAW filter. For example, the acoustic wave filter 31 may be a bulk acoustic wave (BAW) filter.

As illustrated in FIG. 2, the acoustic wave filter 31 includes series arm resonators 311 to 313, parallel arm resonators 314 to 316, an inductor 317, and a capacitor 318.

The series arm resonator 311 is an example of a first series arm resonator, and is connected between a terminal 3101 and the series arm resonator 312.

Specifically, one end of the series arm resonator 311 is connected to the terminal 3101. The other end of the series arm resonator 311 is connected to one end of the series arm resonator 312 and one end of the parallel arm resonator 314.

The series arm resonator 312 is an example of a second series arm resonator, and is connected between the series arm resonators 311 and 313. Specifically, one end of the series arm resonator 312 is connected to the other end of the series arm resonator 311 and one end of the parallel arm resonator 314. The other end of the series arm resonator 312 is connected to one end of the series arm resonator 313 and one end of the parallel arm resonator 315.

The series arm resonator 313 is an example of a third series arm resonator, and is connected between the series arm resonator 312 and a terminal 3102. Specifically, one end of the series arm resonator 313 is connected to the other end of the series arm resonator 312 and one end of the parallel arm resonator 315. The other end of the series arm resonator 313 is connected to the terminal 3102 and one end of the parallel arm resonator 316.

The parallel arm resonator 314 is connected between a path between the series arm resonators 311 and 312 and a ground. Specifically, one end of the parallel arm resonator 314 is connected to the other end of the series arm resonator 311 and one end of the series arm resonator 312. The other end of the parallel arm resonator 314 is connected to the ground via a terminal 3103 and the inductor 317.

The parallel arm resonator 315 is connected between a path between the series arm resonators 312 and 313 and the ground. Specifically, one end of the parallel arm resonator 315 is connected to the other end of the series arm resonator 312 and one end of the series arm resonator 313. The other end of the parallel arm resonator 315 is connected to the ground and one end of the capacitor 318 via a terminal 3104.

The parallel arm resonator 316 is connected between a path between the series arm resonator 313 and the terminal 3102 and the ground. Specifically, one end of the parallel arm resonator 316 is connected to the other end of the series arm resonator 313 and the terminal 3102. The other end of the parallel arm resonator 316 is connected to the ground and the other end of the capacitor 318 via a terminal 3105.

Note that each of the series arm resonators 311 to 313 and the parallel arm resonators 314 to 316 may be constituted by two or more division resonators. The division resonator is a resonator obtained by dividing one resonator in series or in parallel.

The inductor 317 is connected between the series arm resonators 311 and 312 and the ground. Specifically, one end of the inductor 317 is connected to the other end of the parallel arm resonator 314 via the terminal 3103. The other end of the inductor 317 is connected to the ground.

The capacitor 318 is connected between the series arm resonators 312 and 313 and the ground. Specifically, one end of the capacitor 318 is connected to the other end of the parallel arm resonator 315 via the terminal 3104 and is connected to the ground. The other end of the capacitor 318 is connected to the other end of the parallel arm resonator 316 via the terminal 3105 and is connected to the ground.

Such an acoustic wave filter 31 is implemented by a filter component 3100 and passive components 3170 and 3180. Specifically, the series arm resonators 311 to 313 and the parallel arm resonators 314 to 316 are mounted on the filter component 3100 including a plurality of terminals 3101 to 3106. The inductor 317 is mounted on the passive component 3170. The capacitor 318 is mounted on the passive component 3180.

An acoustic wave filter 32 is an example of a second acoustic wave filter, and is connected between the antenna connection terminal 100 and a radio frequency input terminal 112. In the present embodiment, the acoustic wave filter 32 is a SAW filter and functions as a band pass filter having a pass band including a band B. Note that the acoustic wave filter 32 is not limited to the SAW filter. For example, the acoustic wave filter 32 may be a BAW filter.

As illustrated in FIG. 2, the acoustic wave filter 32 includes series arm resonators 321 to 323, parallel arm resonators 324 to 326, and a capacitor 327.

The series arm resonator 321 is an example of a fourth series arm resonator, and is connected between a terminal 3201 and the series arm resonator 322.

Specifically, one end of the series arm resonator 321 is connected to the terminal 3201. The other end of the series arm resonator 321 is connected to one end of the series arm resonator 322 and one end of the parallel arm resonator 324.

The series arm resonator 322 is an example of a fifth series arm resonator, and is connected between the series arm resonators 321 and 323. Specifically, one end of the series arm resonator 322 is connected to the other end of the series arm resonator 321 and one end of the parallel arm resonator 324. The other end of the series arm resonator 322 is connected to one end of the series arm resonator 323 and one end of the parallel arm resonator 325.

The series arm resonator 323 is an example of a sixth series arm resonator, and is connected between the series arm resonator 322 and a terminal 3202. Specifically, one end of the series arm resonator 323 is connected to the other end of the series arm resonator 322 and one end of the parallel arm resonator 325. The other end of the series arm resonator 323 is connected to the terminal 3202 and one end of the parallel arm resonator 326.

The parallel arm resonator 324 is connected between a path between the series arm resonators 321 and 322 and the ground. Specifically, one end of the parallel arm resonator 324 is connected to the other end of the series arm resonator 321 and one end of the series arm resonator 322. The other end of the parallel arm resonator 324 is connected to the ground via a terminal 3203.

The parallel arm resonator 325 is connected between a path between the series arm resonators 322 and 323 and the ground. Specifically, one end of the parallel arm resonator 325 is connected to the other end of the series arm resonator 322 and one end of the series arm resonator 323. The other end of the parallel arm resonator 325 is connected to the ground and one end of the capacitor 327 via a terminal 3204.

The parallel arm resonator 326 is connected between a path between the series arm resonator 323 and the terminal 3202 and the ground. Specifically, one end of the parallel arm resonator 326 is connected to the other end of the series arm resonator 323 and the terminal 3202. The other end of the parallel arm resonator 326 is connected to the ground and the other end of the capacitor 327 via a terminal 3205.

The capacitor 327 is connected between the series arm resonators 322 and 323 and the ground. Specifically, one end of the capacitor 327 is connected to the other end of the parallel arm resonator 325 via the terminal 3204 and is connected to the ground. The other end of the capacitor 327 is connected to the other end of the parallel arm resonator 326 via the terminal 3205 and is connected to the ground.

Such an acoustic wave filter 32 is implemented by the filter component 3200 and a passive component 3270.

Specifically, the series arm resonators 321 to 323 and the parallel arm resonators 324 to 326 are mounted on the filter component 3200 including a plurality of terminals 3201 to 3206. The capacitor 327 is mounted on the passive component 3270.

Note that the bands A and B are different frequency bands for a communication system constructed by using a radio access technology (RAT). The bands A and B are defined in advance by standards bodies or the like (such as 3rd Generation Partnership Project (3GPP (registered trademark)), Institute of Electrical and Electronics Engineers (IEEE) and the like). Examples of the communication system may include a 5th Generation New Radio (5GNR) system, a Long Term Evolution (LTE) system, a Wireless Local Area Network (WLAN) system, and the like.

An inductor 41 is a so-called series inductor and is connected between the acoustic wave filter 31 and the radio frequency input terminal 111. Specifically, one end of the inductor 41 is connected to the radio frequency input terminal 111, and the other end of the inductor 41 is connected to the acoustic wave filter 31. Thus, the inductor 41 can achieve impedance matching between the radio frequency input terminal 111 and the acoustic wave filter 31. Note that the inductor 41 may be a so-called shunt inductor, and may be connected between a path between the acoustic wave filter 31 and the radio frequency input terminal 111 and the ground.

The inductor 42 is a so-called shunt inductor, and is connected between a path between the acoustic wave filter 31 and the switch 51 and the ground. Specifically, one end of the inductor 42 is connected to a path between the acoustic wave filter 31 and the switch 51, and the other end of the inductor 42 is connected to the ground. Note that the inductor 42 may be a so-called series inductor, and may be connected between the acoustic wave filter 31 and the switch 51.

The inductor 43 is a so-called series inductor, and is connected between the acoustic wave filter 32 and the radio frequency input terminal 112. Specifically, one end of the inductor 43 is connected to the radio frequency input terminal 112, and the other end of the inductor 43 is connected to the acoustic wave filter 32. Thus, the inductor 43 can achieve impedance matching between the radio frequency input terminal 112 and the acoustic wave filter 32. Note that the inductor 43 may be a so-called shunt inductor, and may be connected between a path between the acoustic wave filter 32 and the radio frequency input terminal 112 and the ground.

The inductor 44 is a so-called shunt inductor, and is connected between a path between the acoustic wave filter 32 and the switch 51 and the ground. Specifically, one end of the inductor 44 is connected to a path between the acoustic wave filter 32 and the switch 51, and the other end of the inductor 44 is connected to the ground. Note that the inductor 44 may be a so-called series inductor, and may be connected between the acoustic wave filter 32 and the switch 51.

Such inductors 41 to 44 are mounted at passive components 4100, 4200, 4300, and 4400, respectively. Note that the radio frequency module 1 may further include one or more inductors and/or one or more capacitors in addition to the inductors 41 to 44 for impedance matching. Additionally, the radio frequency module 1 may include one or more capacitors instead of the inductors 41 to 44.

The switch 51 is connected between the antenna connection terminal 100 and the acoustic wave filters 31 and 32. Specifically, the switch 51 includes a common terminal 511 connected to the antenna connection terminal 100, a selection terminal 512 connected to the acoustic wave filter 31, and a selection terminal 513 connected to the acoustic wave filter 32.

In this connection configuration, the switch 51 can selectively connect the common terminal 511 to the selection terminals 512 and 513 based on a control signal from the RFIC 3. That is, the switch 51 can switch connection of the antenna connection terminal 100 between the acoustic wave filters 31 and 32. The switch 51 is constituted by, for example, a single-pole double-throw (SPDT) switch circuit.

Such a switch 51 is mounted on a switch component 5100. Note that the switch 51 may be capable of connecting the common terminal 511 to the two selection terminals 512 and 513 at the same time. In addition, the switch 51 does not need to be included in the radio frequency module 1.

1.3 Implementation Example of Radio Frequency Module 1

Figure 3:
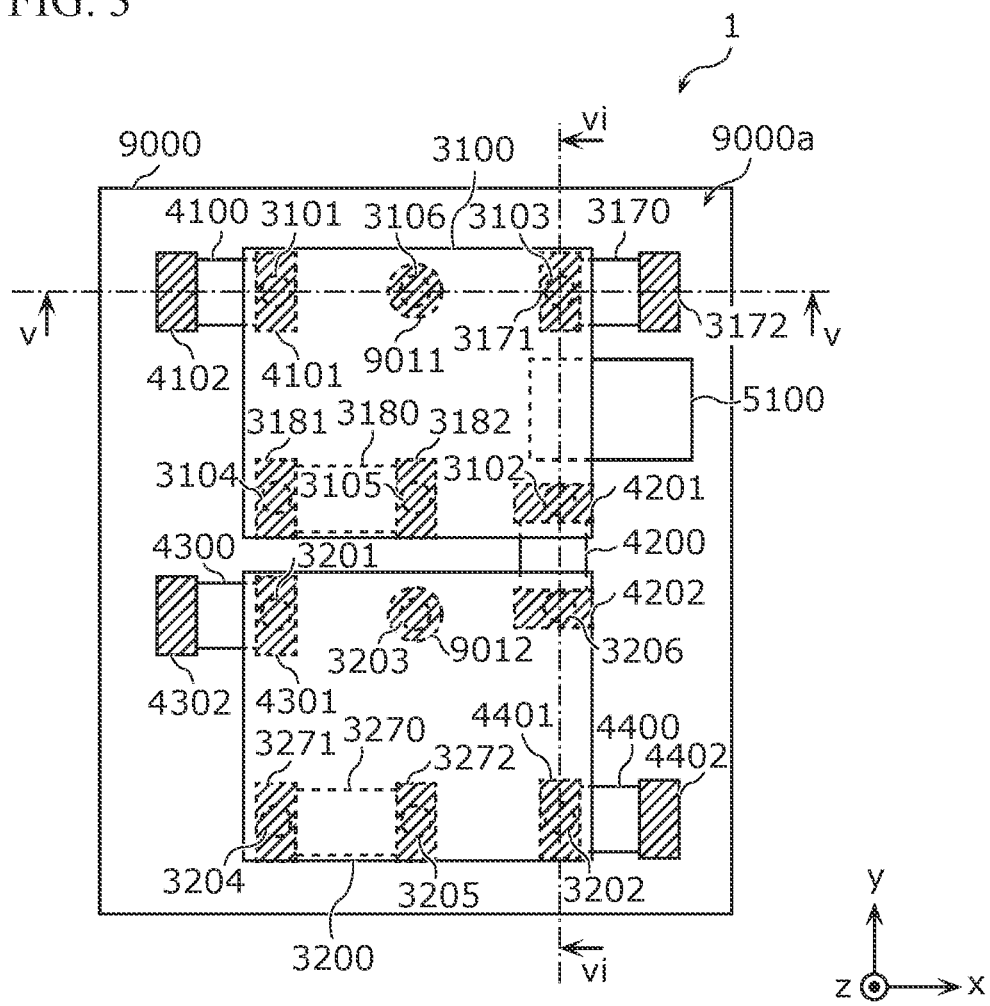
FIG. 3 is a plan view of the radio frequency module according to Embodiment 1.
Figure 4:
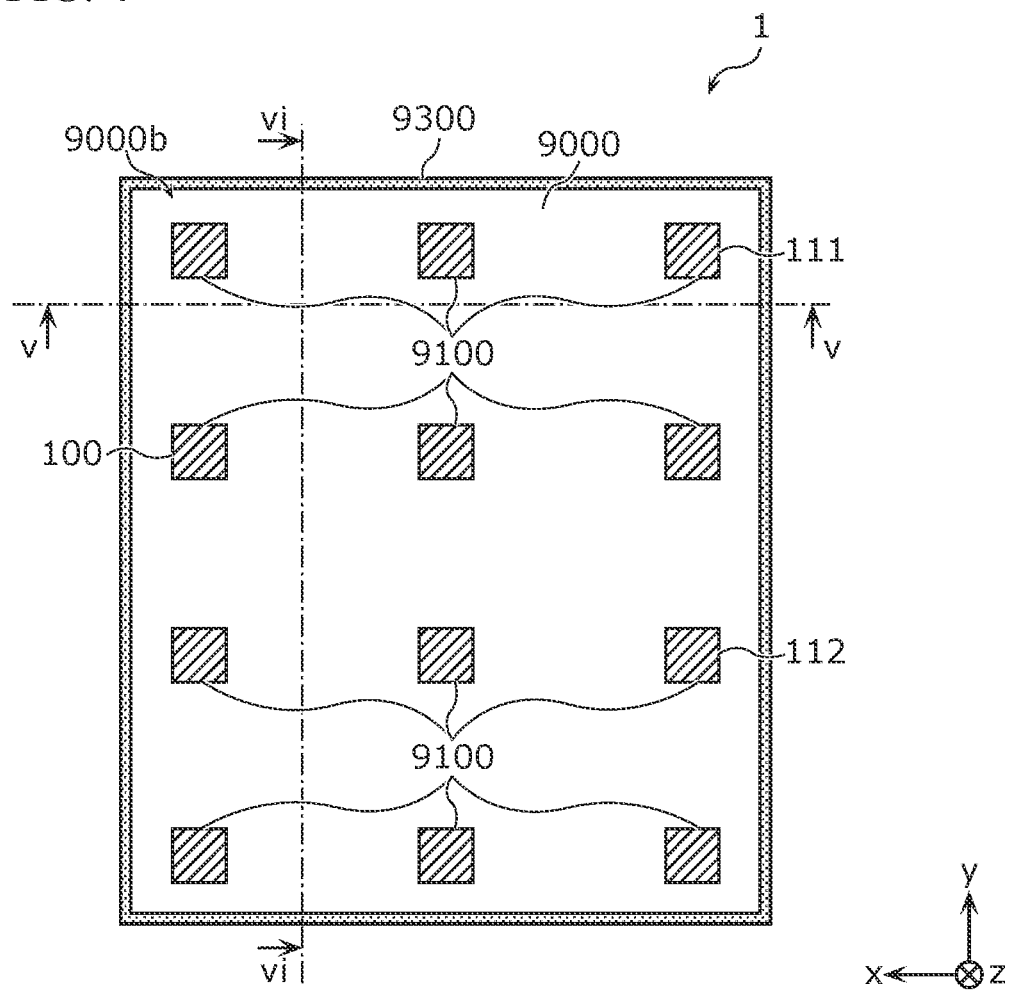
FIG. 4 is a bottom view of the radio frequency module according to Embodiment 1.
Figure 5:
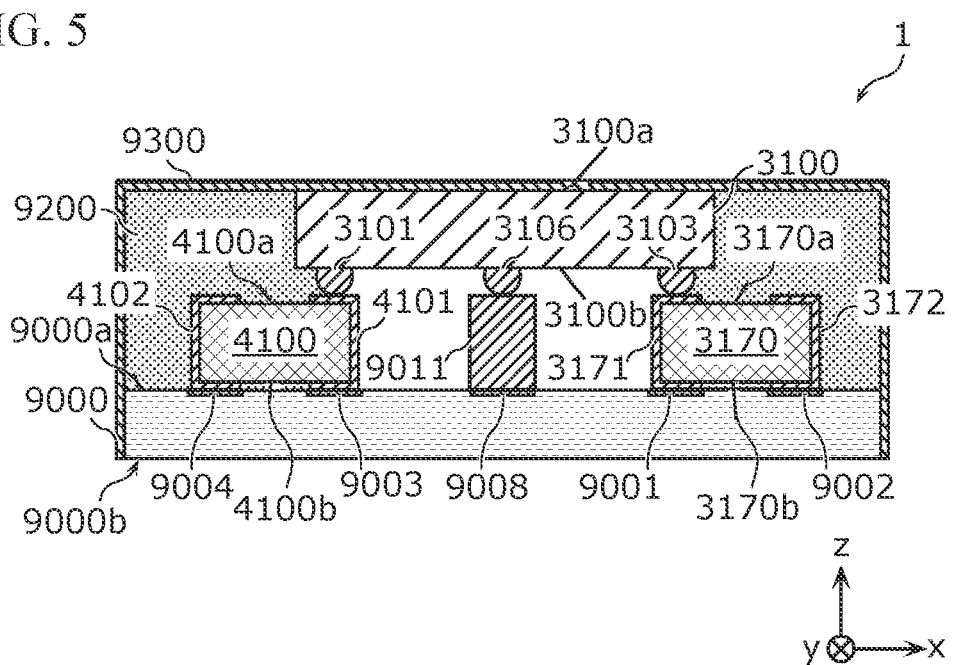
FIG. 5 is a cross-sectional view of the radio frequency module according to Embodiment 1.
Figure 6:
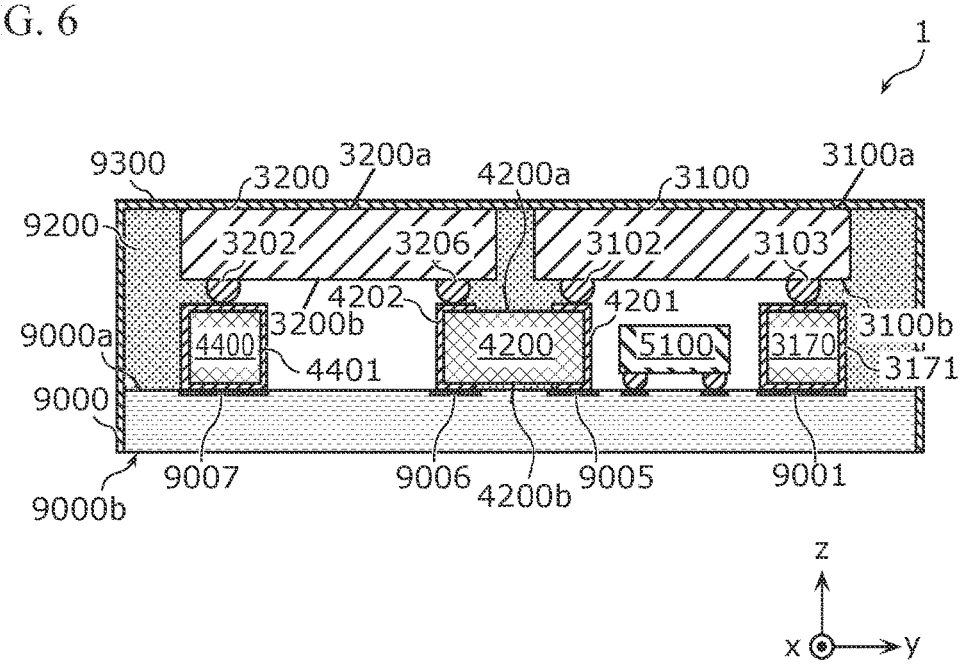
FIG. 6 is a cross-sectional view of the radio frequency module according to Embodiment 1.
Figure 7:
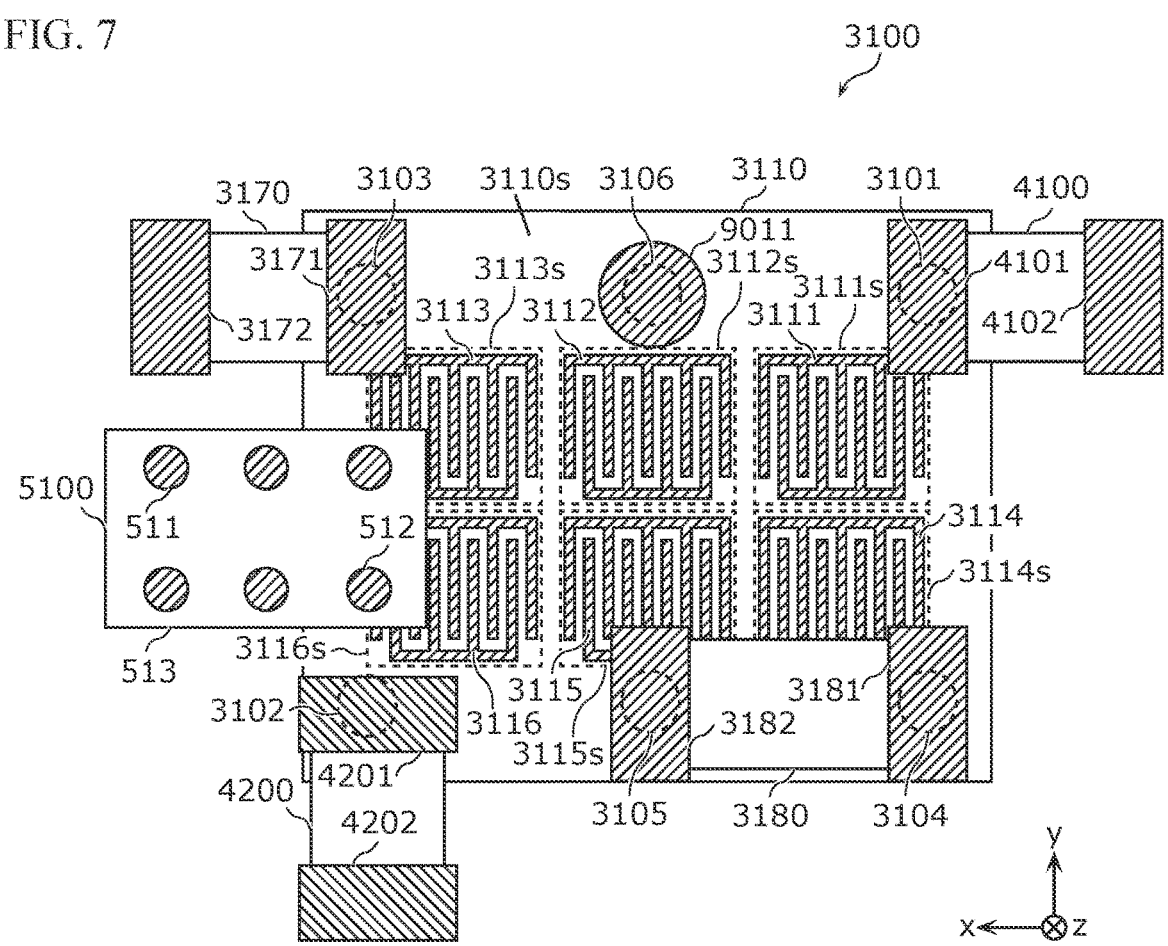
FIG. 7 is a bottom view of a filter component according to Embodiment 1.
Figure 8:
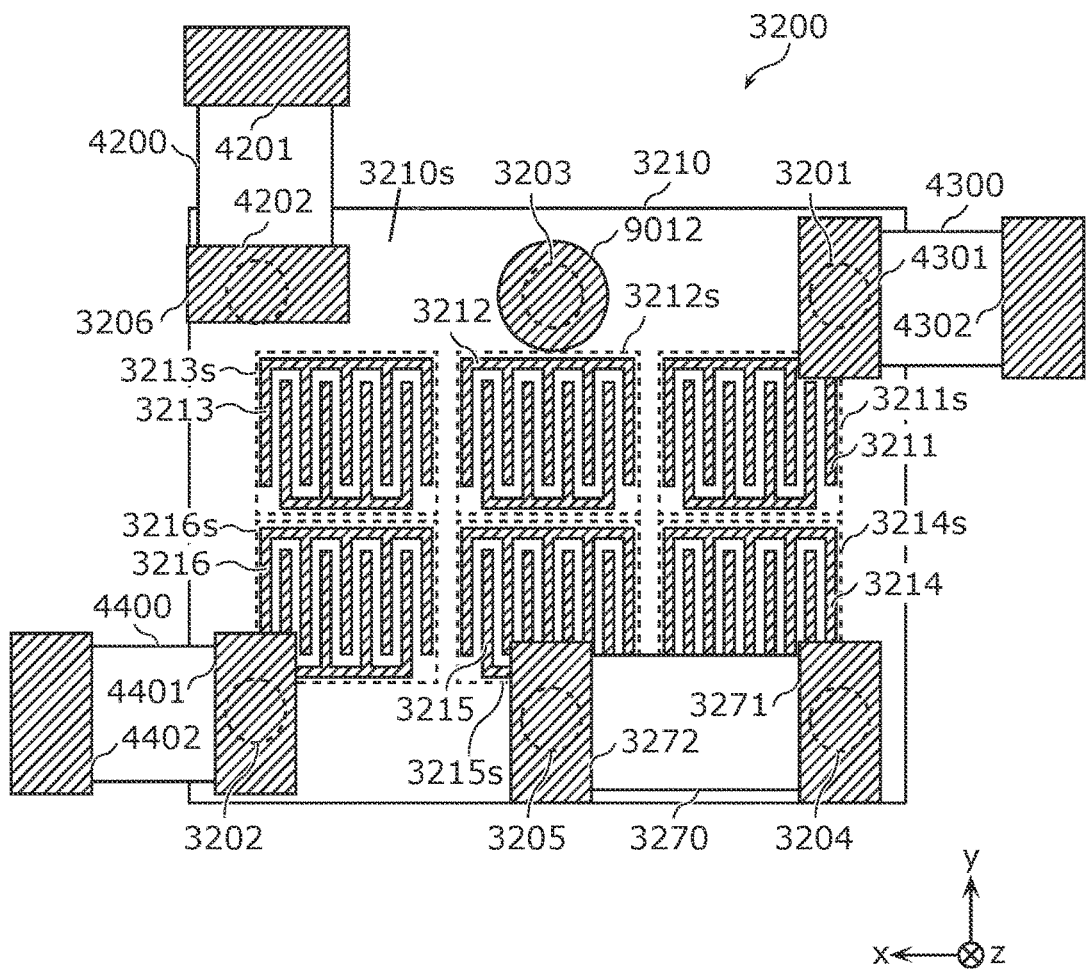
FIG. 8 is a bottom view of the filter component according to Embodiment 1.

Next, an implementation example of the radio frequency module 1 will be described with reference to FIG. 3 to FIG. 8. FIG. 3 is a plan view of the radio frequency module 1 according to the present embodiment. FIG. 4 is a bottom view of the radio frequency module 1 according to the present embodiment. FIG. 5 and FIG. 6 are cross-sectional views of the radio frequency module 1 according to the present embodiment. The cross sections of the radio frequency module 1 in FIG. 5 and FIG. 6 are cross sections respectively taken along lines v-v and vi-vi in FIG. 3 and FIG. 4. FIG. 7 is a bottom view of the filter component 3100 according to the present embodiment. FIG. 8 is a bottom view of the filter component 3200 according to the present embodiment.

In FIG. 3 to FIG. 6, illustration of wiring lines connecting a plurality of circuit components disposed at a module substrate 9000 is omitted. In addition, in FIG. 3, illustration of a resin member 9200 covering the plurality of circuit components and a metal electrode layer 9300 covering a surface of the resin member 9200 is omitted, and components blocked by the filter components 3100 and 3200 are indicated by broken lines.

It should be noted that FIG. 3 to FIG. 8 are exemplary configurations, and the radio frequency module 1 may be implemented by using any of a variety of circuit implementations and circuit technologies. Thus, description of the radio frequency module 1, which will be provided below, should not be interpreted in a limited manner.

The radio frequency module 1 includes the module substrate 9000, post electrodes 9011 and 9012, the resin member 9200, the metal electrode layer 9300, and a plurality of bump electrodes 9100, in addition to the plurality of circuit components illustrated in FIG. 2.

The module substrate 9000 includes main surfaces 9000a and 9000b opposed to each other. As the module substrate 9000, for example, a low temperature co-fired ceramics (LTCC) substrate or a high temperature co-fired ceramics (HTCC) substrate having a laminated structure of a plurality of dielectric layers, a component built-in substrate, a substrate including a redistribution layer (RDL), a printed substrate, or the like can be used, but the module substrate 9000 is not limited thereto.

The filter components 3100 and 3200, the passive components 3170, 3180, 3270, 4100, 4200, 4300, and 4400, a switch component 5100, and the post electrodes 9011 and 9012 are disposed at the main surface 9000a of the module substrate 9000. On the other hand, the plurality of bump electrodes 9100 is disposed at the main surface 9000b of the module substrate 9000.

The filter component 3100 is an example of the first filter component, and is a SAW device where the series arm resonators 311 to 313 and the parallel arm resonators 314 to 316 are mounted. The filter component 3100 is disposed over the passive components 3170, 3180, 4100, and 4200 and the post electrode 9011. The filter component 3100 includes the plurality of terminals 3101 to 3106, a piezoelectric substrate 3110, and functional electrodes 3111 to 3116, and includes main surfaces 3100a and 3100b opposed to each other.

The main surface 3100a is an example of a first main surface, and is physically connected to the metal electrode layer 9300. In FIG. 5 and FIG. 6, the main surface 3100a is directly connected to the metal electrode layer 9300, and is in contact with the metal electrode layer 9300. Thus, heat dissipation of the filter component 3100 can be improved. Note that the entire main surface 3100a does not need to be in contact with the metal electrode layer 9300, and only a part of the main surface 3100a may be in contact with the metal electrode layer 9300. Additionally, the main surface 3100a does not need to be directly connected to the metal electrode layer 9300. For example, the main surface 3100a may be indirectly connected to the metal electrode layer 9300 with a member having a higher thermal conductivity than that of the resin member 9200 interposed therebetween.

The main surface 3100b is an example of a second main surface, and faces the main surface 9000a of the module substrate 9000. On the main surface 3100b, the plurality of terminals 3101 to 3106 and the functional electrodes 3111 to 3116 respectively constituting the series arm resonators 311 to 313 and the parallel arm resonators 314 to 316 are disposed.

The terminal 3101 is a connection terminal of the filter component 3100, is electrically connected to the functional electrode 3111 in the filter component 3100, and is electrically connected to an electrode 4101 of the passive component 4100 outside the filter component 3100. The terminal 3101 overlaps a part of the electrode 4101 of the passive component 4100 in a plan view of the module substrate 9000.

The terminal 3102 is a connection terminal of the filter component 3100, is electrically connected to the functional electrode 3113 in the filter component 3100, and is electrically connected to an electrode 4201 of the passive component 4200 outside the filter component 3100. The terminal 3102 overlaps a part of the electrode 4201 of the passive component 4200 in the plan view of the module substrate 9000.

The terminal 3103 is a connection terminal of the filter component 3100, is electrically connected to the functional electrode 3114 in the filter component 3100, and is electrically connected to an electrode 3171 of the passive component 3170 outside the filter component 3100. The terminal 3103 overlaps a part of the electrode 3171 of the passive component 3170 in the plan view of the module substrate 9000.

The terminal 3104 is a connection terminal of the filter component 3100, is electrically connected to the functional electrode 3115 in the filter component 3100, and is electrically connected to an electrode 3181 of the passive component 3180 outside the filter component 3100. The terminal 3104 overlaps a part of the electrode 3181 of the passive component 3180 in the plan view of the module substrate 9000.

The terminal 3105 is a connection terminal of the filter component 3100, is electrically connected to the functional electrode 3116 in the filter component 3100, and is electrically connected to an electrode 3182 of the passive component 3180 outside the filter component 3100. The terminal 3105 overlaps a part of the electrode 3182 of the passive component 3180 in the plan view of the module substrate 9000.

The terminal 3106 is a non-connection terminal of the filter component 3100, is not electrically connected to the functional electrode in the filter component 3100, and is electrically connected to the post electrode 9011 outside the filter component 3100. The terminal 3106 overlaps a part of the post electrode 9011 in the plan view of the module substrate 9000.

The piezoelectric substrate 3110 includes a surface 3110s through which an acoustic wave propagates. The surface 3110s faces the main surface 9000a of the module substrate 9000, and constitutes the main surface 3100b of the filter component 3100. As the piezoelectric substrate 3110, for example, a substrate formed of lithium niobate ($LiNbO_3$) single crystal or lithium tantalate ($LiTaO_3$) single crystal is used, but the present disclosure is not limited thereto.

The functional electrode 3111 is disposed on the surface 3110s of the piezoelectric substrate 3110, and is capable of converting an acoustic wave propagating through the surface 3110s of the piezoelectric substrate 3110 into an electric signal or converting an electric signal into an acoustic wave. Thus, the functional electrode 3111 can constitute the series arm resonator 311. A region 3111s occupied by the functional electrode 3111 corresponds to a region formed with the series arm resonator 311. The region 3111s is included in a region (the other region) excluding a region 3112s, and is allowed to overlap the passive components 3170, 3180, 4100, and 4200 in the plan view of the module substrate 9000.

The functional electrode 3112 is disposed on the surface 3110s of the piezoelectric substrate 3110, and is capable of converting an acoustic wave propagating through the surface 3110s of the piezoelectric substrate 3110 into an electric signal or converting an electric signal into an acoustic wave. Thus, the functional electrode 3112 can constitute the series arm resonator 312. The region 3112s occupied by the functional electrode 3112 corresponds to a region formed with the series arm resonator 312. The region 3112s formed with such a series arm resonator 312 does not overlap any of the passive components 3170, 3180, 4100, and 4200 in the plan view of the module substrate 9000.

The functional electrode 3113 is disposed on the surface 3110s of the piezoelectric substrate 3110, and is capable of converting an acoustic wave propagating through the surface 3110s of the piezoelectric substrate 3110 into an electric signal or converting an electric signal into an acoustic wave. Thus, the functional electrode 3113 can constitute the series arm resonator 313. A region 3113s occupied by the functional electrode 3113 corresponds to a region formed with the series arm resonator 313. The region 3113s is included in a region (the other region) excluding the region 3112s, and is allowed to overlap the passive components 3170, 3180, 4100, and 4200 in the plan view of the module substrate 9000.

The functional electrode 3114 is disposed on the surface 3110s of the piezoelectric substrate 3110, and is capable of converting an acoustic wave propagating through the surface 3110s of the piezoelectric substrate 3110 into an electric signal or converting an electric signal into an acoustic wave. Thus, the functional electrode 3114 can constitute the parallel arm resonator 314. A region 3114s occupied by the functional electrode 3114 corresponds to a region formed with the parallel arm resonator 314. The region 3114s is included in a region (the other region) excluding the region 3112s, and is allowed to overlap the passive components 3170, 3180, 4100, and 4200 in the plan view of the module substrate 9000.

The functional electrode 3115 is disposed on the surface 3110s of the piezoelectric substrate 3110, and is capable of converting an acoustic wave propagating through the surface 3110s of the piezoelectric substrate 3110 into an electric signal or converting an electric signal into an acoustic wave. Thus, the functional electrode 3115 can constitute the parallel arm resonator 315. A region 3115s occupied by the functional electrode 3115 corresponds to a region formed with the parallel arm resonator 315. The region 3115s is included in a region (the other region) excluding the region 3112s, and is allowed to overlap the passive components 3170, 3180, 4100, and 4200 in the plan view of the module substrate 9000.

The functional electrode 3116 is disposed on the surface 3110s of the piezoelectric substrate 3110, and is capable of converting an acoustic wave propagating through the surface 3110s of the piezoelectric substrate 3110 into an electric signal or converting an electric signal into an acoustic wave. Thus, the functional electrode 3116 can constitute the parallel arm resonator 316. A region 3116s occupied by the functional electrode 3116 corresponds to a region formed with the parallel arm resonator 316. The region 3116s is included in a region (the other region) excluding the region 3112s, and is allowed to overlap the passive components 3170, 3180, 4100, and 4200 in the plan view of the module substrate 9000.

As the functional electrodes 3111 to 3116, interdigital transducer (IDT) electrodes can be used, and copper (Cu), aluminum (Al), platinum (Pt), a laminated body thereof, or an alloy thereof is used as a main material. Note that the functional electrodes 3111 to 3116 do not need to be limited to such electrodes.

Note that although the functional electrodes 3111 to 3116 are disposed on the surface 3110s of the piezoelectric substrate 3110 facing the main surface 9000a of the module substrate 9000 (that is, the main surface 3100b of the filter component 3100), the arrangement of the functional electrodes 3111 to 3116 is not limited thereto. For example, the functional electrodes 3111 to 3116 may be disposed on the main surface 3100a of the filter component 3100. In this case, the filter component 3100 may include a cover member for forming a gap over the main surface 3100a, and the resin member 9200 may be filled between the filter component 3100 and the module substrate 9000.

Note that the filter component 3100 may include another circuit element. For example, the filter component 3100 may include a capacitor. In this case, the capacitor may be constituted by an IDT electrode. In this case, the IDT electrode constituting the resonator and the IDT electrode constituting the capacitor can be distinguished from each other by a direction in which each electrode finger extends and a direction in which a plurality of electrode fingers is aligned. Specifically, in the IDT electrode constituting the resonator, each electrode finger extends along a propagation direction of an acoustic wave, and a plurality of electrode fingers is aligned along a direction perpendicular to the propagation direction of the acoustic wave.

The filter component 3200 is an example of a second filter component, is a SAW device mounted with the series arm resonators 321 to 323 and the parallel arm resonators 324 to 326, and is disposed over the passive components 3270, 4200, 4300, and 4400 and a post electrode 9012. The filter component 3200 includes a plurality of terminals 3201 to 3206, a piezoelectric substrate 3210, and functional electrodes 3211 to 3216, and includes the main surfaces 3200a and 3200b opposed to each other.

The main surface 3200a is physically connected to the metal electrode layer 9300. In FIG. 6, the main surface 3200a is directly connected to the metal electrode layer 9300, and is in contact with the metal electrode layer 9300. Thus, heat dissipation of the filter component 3200 can be improved. Note that the entire main surface 3200a does not need to be in contact with the metal electrode layer 9300, and only a part of the main surface 3200a may be in contact with the metal electrode layer 9300. In addition, the main surface 3200a does not necessarily have to be directly connected to the metal electrode layer 9300. For example, the main surface 3200a may be indirectly connected to the metal electrode layer 9300 with a member having a higher thermal conductivity than that of the resin member 9200 interposed therebetween.

A main surface 3200b faces the main surface 9000a of the module substrate 9000. On the main surface 3200b, the plurality of terminals 3201 to 3206 and the functional electrodes 3211 to 3216 constituting the series arm resonators 321 to 323 and the parallel arm resonators 324 to 326 are disposed.

The terminal 3201 is a connection terminal of the filter component 3200, is electrically connected to the functional electrode 3211 in the filter component 3200, and is electrically connected to an electrode 4301 of the passive component 4300 outside the filter component 3200. The terminal 3201 overlaps a part of the electrode 4301 of the passive component 4300 in the plan view of the module substrate 9000.

The terminal 3202 is a connection terminal of the filter component 3200, is electrically connected to the functional electrode 3213 in the filter component 3200, and is electrically connected to an electrode 4401 of the passive component 4400 outside the filter component 3200. The terminal 3202 overlaps a part of the electrode 4401 of the passive component 4400 in the plan view of the module substrate 9000.

The terminal 3203 is a connection terminal of the filter component 3200, is electrically connected to the functional electrode 3214 in the filter component 3200, and is electrically connected to the post electrode 9012 outside the filter component 3200. The terminal 3203 overlaps a part of the post electrode 9012 in the plan view of the module substrate 9000.

The terminal 3204 is a connection terminal of the filter component 3200, is electrically connected to the functional electrode 3215 in the filter component 3200, and is electrically connected to an electrode 3271 of the passive component 3270 outside the filter component 3200. The terminal 3204 overlaps a part of the electrode 3271 of the passive component 3270 in the plan view of the module substrate 9000.

The terminal 3205 is a connection terminal of the filter component 3200, is electrically connected to the functional electrode 3216 in the filter component 3200, and is electrically connected to an electrode 3272 of the passive component 3270 outside the filter component 3200. The terminal 3205 overlaps a part of the electrode 3272 of the passive component 3270 in the plan view of the module substrate 9000.

The terminal 3206 is a non-connection terminal of the filter component 3200, is not electrically connected to the functional electrode in the filter component 3200, and is electrically connected to the electrode 4202 of the passive component 4200 outside the filter component 3200. The terminal 3206 overlaps a part of the electrode 4202 of the passive component 4200 in the plan view of the module substrate 9000. Note that the terminal 3206 does not need to be electrically connected to the electrode 4202 of the passive component 4200, and does not need to overlap the electrode 4202 in a plan view.

The piezoelectric substrate 3210 includes a front surface 3210s through which an acoustic wave propagates. The surface 3210s faces the main surface 9000a of the module substrate 9000 and constitutes the main surface 3200b of the filter component 3200. As with the piezoelectric substrate 3110, for example, a substrate made of LiNbO$_3$ single crystal or LiTaO$_3$ single crystal is used as the piezoelectric substrate 3210, but the piezoelectric substrate 3210 is not limited thereto.

The functional electrode 3211 is disposed on the surface 3210s of the piezoelectric substrate 3210, and is capable of converting an acoustic wave propagating through the surface 3210s of the piezoelectric substrate 3210 into an electric signal or converting an electric signal into an acoustic wave. Thus, the functional electrode 3211 can constitute the series arm resonator 321. In other words, the series arm resonator 321 is formed in a region 3211s disposed with the functional electrode 3211.

The functional electrode 3212 is disposed on the surface 3210s of the piezoelectric substrate 3210, and is capable of converting an acoustic wave propagating through the surface 3210s of the piezoelectric substrate 3210 into an electric signal or converting an electric signal into an acoustic wave. Thus, the functional electrode 3212 can constitute the series arm resonator 322. In other words, the series arm resonator 322 is formed in a region 3212s disposed with the functional electrode 3212. Such a region 3212s formed with the series arm resonator 322 does not overlap the passive components 3270, 4200, 4300, and 4400 in the plan view of the module substrate 9000.

The functional electrode 3213 is disposed on the surface 3210s of the piezoelectric substrate 3210, and is capable of converting an acoustic wave propagating through the surface 3210s of the piezoelectric substrate 3210 into an electric signal or converting an electric signal into an acoustic wave. Thus, the functional electrode 3213 can constitute the series arm resonator 323. In other words, the series arm resonator 323 is formed in a region 3213s disposed with the functional electrode 3213.

The functional electrode 3214 is disposed on the surface 3210s of the piezoelectric substrate 3210, and is capable of converting an acoustic wave propagating through the surface 3210s of the piezoelectric substrate 3210 into an electric signal or converting an electric signal into an acoustic wave. Thus, the functional electrode 3214 can constitute the parallel arm resonator 324. That is, the parallel arm resonator 324 is formed in a region 3214s disposed with the functional electrode 3214.

The functional electrode 3215 is disposed on the surface 3210s of the piezoelectric substrate 3210, and is capable of converting an acoustic wave propagating through the surface 3210s of the piezoelectric substrate 3210 into an electric signal or converting an electric signal into an acoustic wave. Thus, the functional electrode 3215 can constitute the parallel arm resonator 325. That is, the parallel arm resonator 325 is formed in a region 3215s disposed with the functional electrode 3215.

The functional electrode 3216 is disposed on the surface 3210s of the piezoelectric substrate 3210, and is capable of converting an acoustic wave propagating through the surface 3210s of the piezoelectric substrate 3210 into an electric signal or converting an electric signal into an acoustic wave. Thus, the functional electrode 3216 can constitute the parallel arm resonator 326. That is, the parallel arm resonator 326 is formed in a region 3216s disposed with the functional electrode 3216.

As with the functional electrodes 3111 to 3116, IDT electrodes can be used as such functional electrodes 3211 to 3216, and Cu, Al, Pt, a laminated body thereof, or an alloy thereof is used as a main material. Note that the functional electrodes 3211 to 3216 do not need to be limited to such electrodes.

Note that although the functional electrodes 3211 to 3216 are disposed on the main surface 3210s of the piezoelectric substrate 3210 facing the main surface 9000a of the module substrate 9000 (that is, the main surface 3200b of the filter component 3200), the arrangement of the functional electrodes 3211 to 3216 is not limited thereto. For example, the functional electrodes 3211 to 3216 may be disposed on the main surface 3200a of the filter component 3200. In this case, the filter component 3200 may include a cover member for forming a gap over the main surface 3200a, and the resin member 9200 may be filled between the filter component 3200 and the module substrate 9000.

Note that as with the filter component 3100, the filter component 3200 may include another circuit element.

The passive component 3170 is a surface mount device (SMD) including the inductor 317, and is a so-called chip inductor. The passive component 3170 includes the electrodes 3171 and 3172 that individually constitute each end of the inductor 317. Each of the electrodes 3171 and 3172 is formed on main surfaces 3170a and 3170b of the passive component 3170 that are opposed to each other and side surfaces connecting the main surfaces 3170a and 3170b. The electrode 3171 is electrically and physically connected to the terminal 3103 of the filter component 3100, and is physically connected to an electrode 9001 on the main surface 9000a of the module substrate 9000. Note that the electrode 3171 is not necessarily electrically connected to the electrode 9001. An electrode 3172 is electrically and physically connected to an electrode 9002 (a ground electrode) on the main surface 9000a of the module substrate 9000.

The passive component 3180 is an SMD including the capacitor 318, and is a so-called chip capacitor. The passive component 3180 includes the electrodes 3181 and 3182 that individually constitute each end of the capacitor 318. Each of the electrodes 3181 and 3182 is formed on two main surfaces of the passive component 3180 that are opposed to each other and side surfaces connecting the main surfaces. The electrode 3181 is electrically and physically connected to the terminal 3104 of the filter component 3100, and is electrically and physically connected to a ground electrode (not illustrated) on the main surface 9000a of the module substrate 9000. The electrode 3182 is electrically and physically connected to the terminal 3105 of the filter component 3100, and is electrically and physically connected to the ground electrode (not illustrated) on the main surface 9000a of the module substrate 9000.

The passive component 3270 is an SMD including the capacitor 327, and is a so-called chip capacitor. The passive component 3270 includes the electrodes 3271 and 3272 that individually constitute each end of the capacitor 327. Each of the electrodes 3271 and 3272 is formed on two main surfaces of the passive component 3270 that are opposed to each other and side surfaces connecting the main surfaces. The electrode 3271 is electrically and physically connected to the terminal 3204 of the filter component 3200, and is electrically and physically connected to the ground electrode (not illustrated) on the main surface 9000a of the module substrate 9000. The electrode 3272 is electrically and physically connected to the terminal 3205 of the filter component 3200, and is electrically and physically connected to the ground electrode (not illustrated) on the main surface 9000a of the module substrate 9000.

The passive component 4100 is an SMD including the inductor 41, and is a so-called chip inductor. The passive component 4100 includes the electrode 4101 and an electrode 4102 that individually constitute each end of the inductor 41. Each of the electrodes 4101 and 4102 is formed on the surfaces 4100a and 4100b of the passive component 4100 that are opposed to each other and side surfaces connecting the main surfaces. The electrode 4101 is electrically and physically connected to the terminal 3101 of the filter component 3100, and is physically connected to an electrode 9003 on the main surface 9000a of the module substrate 9000. Note that the electrode 4101 is not necessarily electrically connected to the electrode 9003. The electrode 4102 is electrically and physically connected to an electrode 9004 that is provided on the main surface 9000a of the module substrate 9000 and that is electrically connected to the bump electrode 9100 functioning as the radio frequency input terminal 111.

The passive component 4200 is an SMD including the inductor 42, and is a so-called chip inductor. The passive component 4200 includes the electrodes 4201 and 4202 that individually constitute each end of the inductor 42. Each of the electrodes 4201 and 4202 is formed on the main surfaces 4200a and 4200b of the passive component 4200 that are opposed to each other and side surfaces connecting the main surfaces 4200a and 4200b. The electrode 4201 is an example of a first electrode, is electrically and physically connected to the terminal 3102 of the filter component 3100, and is electrically and physically connected to an electrode 9005 that is provided on the main surface 9000a of the module substrate 9000 and that is electrically connected to the selection terminal 512 of the switch component 5100. The electrode 4202 is an example of a second electrode, is electrically and physically connected to the terminal 3206 of the filter component 3200, and is electrically and physically connected to an electrode 9006 (a ground electrode) on the main surface 9000a of the module substrate 9000. Note that the filter component 3200 does not need to be disposed over the passive component 4200. In this case, the electrode 4202 does not need to be electrically and physically connected to the terminal 3206.

The passive component 4300 is an SMD including the inductor 43, and is a so-called chip inductor. The passive component 4300 includes the electrode 4301 and an electrode 4302 that individually constitute each end of the inductor 43. Each of the electrodes 4301 and 4302 is formed on two main surfaces of the passive component 4300 that are opposed to each other and side surfaces connecting the main surfaces. The electrode 4301 is electrically and physically connected to the terminal 3201 of the filter component 3200, and is physically connected to an electrode (a non-connection electrode) on the main surface 9000a of the module substrate 9000. The electrode 4302 is electrically and physically connected to an electrode (not illustrated) that is provided on the main surface 9000a of the module substrate 9000 and that is electrically connected to the bump electrode 9100 functioning as the radio frequency input terminal 112.

The passive component 4400 is an SMD including the inductor 44, and is a so-called chip inductor. The passive component 4400 includes the electrode 4401 and an electrode 4402 that individually constitute each end of the inductor 44. Each of the electrodes 4401 and 4402 is formed on two main surfaces of the passive component 4400 that are opposed to each other and side surfaces connecting the main surfaces. The electrode 4401 is electrically and physically connected to the terminal 3202 of the filter component 3200, and is electrically and physically connected to an electrode 9007 that is provided on the main surface 9000a of the module substrate 9000 and that is electrically connected to the selection terminal 513 of the switch component 5100. The electrode 4402 is electrically and physically connected to the ground electrode (not illustrated) on the main surface 9000a of the module substrate 9000.

Note that although each electrode of each passive component is formed on two main surfaces (for example, the main surfaces 3170a and 3170b of the passive component 3170), the present disclosure is not limited to this. For example, the electrode 3172 of the passive component 3170, the electrode 4102 of the passive component 4100, the electrode 4302 of the passive component 4300, and the electrode 4402 of the passive component 4400 may be formed on a main surface (for example, the main surface 3170b) facing the main surface 9000a of the module substrate 9000, and does not need to be formed on a main surface (for example, the main surface 3170a, or the like) that is provided at the opposite side to the above-described main surface.

In addition, in each electrode of each passive component, the electrodes formed on the two main surfaces are electrically connected to each other via the electrodes formed on the side surfaces of the passive component, but the present disclosure is not limited to this. For example, the electrodes formed on the two main surfaces may be electrically connected to each other via a via in the passive component.

The post electrode 9011 is an example of a metal member, and extends from an electrode 9008 (a ground electrode) on the main surface 9000a of the module substrate 9000 to the terminal 3106 of the filter component 3100, as illustrated in FIG. 5. To be specific, one end of the post electrode 9011 is electrically and physically connected to the electrode 9008 on the main surface 9000a of the module substrate 9000, and the other end of the post electrode 9011 is electrically and physically connected to the terminal 3106 of the filter component 3100. Note that the post electrode 9011 does not need to be included in the radio frequency module 1.

The post electrode 9012 is an example of a metal member, and extends from the ground electrode (not illustrated) on the main surface 9000a of the module substrate 9000 to the terminal 3203 of the filter component 3200. To be specific, one end of the post electrode 9012 is electrically and physically connected to the ground electrode on the main surface 9000a of the module substrate 9000, and the other end of the post electrode 9012 is electrically and physically connected to the terminal 3203 of the filter component 3200. Note that the post electrode 9012 does not need to be included in the radio frequency module 1.

A part of the switch component 5100 overlaps a part of the filter component 3100 in the plan view of the module substrate 9000. The switch component 5100 includes the common terminal 511 and the selection terminals 512 and 513. The common terminal 511 is electrically connected to the bump electrode 9100 functioning as the antenna connection terminal 100 through a wiring layer, a via (not illustrated), and the like of the module substrate 9000. The selection terminal 512 is electrically connected to the terminal 3102 of the filter component 3100 via a wiring layer (not illustrated) or the like of the module substrate 9000. The selection terminal 513 is electrically connected to the terminal 3202 of the filter component 3200 via a wiring layer (not illustrated) or the like of the module substrate 9000.

As the switch component 5100, a semiconductor integrated circuit including a field effect transistor (FET) can be used. In this case, for example, silicon (Si) is used as a semiconductor material. Note that at least one of gallium arsenide (GaAs), silicon germanium (SiGe), and gallium nitride (GaN) may be used as the semiconductor material.

The plurality of bump electrodes 9100 function as a plurality of external connection terminals including a ground terminal in addition to the antenna connection terminal 100 and the radio frequency input terminals 111 and 112 illustrated in FIG. 1. Each of the plurality of bump electrodes 9100 is electrically connected to an input/output terminal and/or a ground terminal or the like (not illustrated) on a mother board disposed in the negative direction of the z-axis of the radio frequency module 1. Copper electrodes can be used as the plurality of bump electrodes 9100, but the present disclosure is not limited thereto. For example, solder electrodes may be used as the plurality of bump electrodes 9100.

As illustrated in FIG. 5 and FIG. 6, the resin member 9200 covers a part of the main surface 9000a of the module substrate 9000 and a part of each circuit component over the main surface 9000a. Note that the resin member 9200 is not filled between the filter components 3100 and 3200 and the main surface 9000a of the module substrate 9000. Thus, a gap is formed between the main surface 3100b of the filter component 3100 and the main surface 9000a of the module substrate 9000, and a gap is also formed between the main surface 3200b of the filter component 3200 and the main surface 9000a of the module substrate 9000. As a material of the resin member 9200, for example, epoxy resin can be used. Note that the material of the resin member 9200 is not limited to the epoxy resin. The resin member 9200 has functions for ensuring reliability such as mechanical strength, moisture resistance and the like of the circuit components over the main surface 9000a. Note that the resin member 9200 does not necessarily have to be included in the radio frequency module 1.

The metal electrode layer 9300 is a metal thin film formed by sputtering, for example. The metal electrode layer 9300 is formed so as to cover a surface (a top surface and a side surface) of the resin member 9200 as illustrated in FIG. 5 and FIG. 6. Further, the metal electrode layer 9300 is physically connected to the main surface 3100a of the filter component 3100 and the main surface 3200a of the filter component 3200. The metal electrode layer 9300 is connected to the ground and functions as a shield electrode. That is, the metal electrode layer 9300 can suppress entrance of external noise into the radio frequency module 1 and suppress interference to another module or another device due to noise generated in the radio frequency module 1. Note that the metal electrode layer 9300 does not need to be included in the radio frequency module 1.

1.4 Effects and the Like

As described above, the radio frequency module 1 according to the present embodiment includes the module substrate 9000, the plurality of passive components 3170, 3180, 4100, and 4200 disposed on the main surface 9000a of the module substrate 9000, and the filter component 3100 disposed over the plurality of passive components 3170, 3180, 4100, and 4200, wherein the filter component 3100 includes the series arm resonators 311 to 313 constituting the acoustic wave filter 31, the series arm resonator 312 is connected between the series arm resonators 311 and 313, and the region 3112s of the filter component 3100 formed with the series arm resonator 312 does not overlap the plurality of passive components 3170, 3180, 4100, and 4200, and at least a part of the other region (the region excluding the region 3112s) of the filter component 3100 overlaps at least a part of each of the plurality of passive components 3170, 3180, 4100, and 4200 in the plan view of the module substrate 9000.

According to this, the filter component 3100 is disposed over the plurality of passive components 3170, 3180, 4100 and 4200. Thus, it is possible to reduce an area occupied by the filter component 3100 and the plurality of passive components 3170, 3180, 4100, and 4200 on the main surface 9000a of the module substrate 9000, and it is possible to contribute to miniaturization of the radio frequency module 1. Furthermore, in the plan view of the module substrate 9000, the region 3112s formed with the series arm resonator 312 of the filter component 3100 does not overlap the plurality of passive components 3170, 3180, 4100, and 4200. Thus, it is possible to suppress deterioration of characteristics of the series arm resonator 312 due to the plurality of passive components 3170, 3180, 4100, and 4200, and it is to suppress deterioration of characteristics (for example, signal quality) of the radio frequency module 1.

Further, for example, in the radio frequency module 1 according to the present embodiment, the filter component 3100 may include the plurality of terminals 3101 to 3106, at least one of the plurality of passive components 3170, 3180, 4100, and 4200 (for example, the passive component 4100) may include an electrode (for example, the electrode 4101) electrically connected to at least one terminal (for example, the terminal 3101) among the plurality of terminals 3101 to 3106 of the filter component 3100, and at least a part of the electrode (for example, the electrode 4101) may overlap at least a part of the at least one terminal (for example, the terminal 3101) in the plan view of the module substrate 9000.

According to this configuration, since the electrode (for example, the electrode 4101 of the passive component 4100) of the passive component electrically connected to the terminal (for example, the terminal 3101) of the filter component 3100 can be superimposed with the at least one terminal described above, a wiring length between the filter component 3100 and the passive component can be reduced. Thus, the resistance loss due to the wiring line and/or the mismatching loss due to stray capacitance of the wiring line can be reduced, and characteristics (for example, power efficiency) of the radio frequency module 1 can be improved.

Further, for example, in the radio frequency module 1 according to the present embodiment, each of the series arm resonators 311 to 313 may be a SAW resonator constituted by the functional electrodes 3111 to 3116, and the functional electrodes 3111 to 3116 may be disposed on the main surface 3100b of the filter component 3100 facing the main surface 9000a of the module substrate 9000.

According to this configuration, since the functional electrodes 3111 to 3116 are disposed on the main surface 3100b of the filter component 3100, a space between the filter component 3100 and the module substrate 9000 that is generated by the plurality of passive components 3170, 3180, 4100, and 4200 as a space for the SAW resonators can be effectively utilized.

In addition, for example, in the radio frequency module 1 according to the present embodiment, the acoustic wave filter 31 may be connected between the antenna connection terminal 100 and the radio frequency input terminal 111, and the plurality of passive components 3170, 3180, 4100, and 4200 may include an SMD (the passive component 4100) including the inductor 41 connected between the acoustic wave filter 31 and the radio frequency input terminal 111.

According to this configuration, since the passive component 4100 includes the inductor 41 connected between the acoustic wave filter 31 and the radio frequency input terminal 111, the wiring length between the inductor 41 and the acoustic wave filter 31 can be reduced and the resistance loss due to the wiring line and/or the mismatching loss due to the stray capacitance of the wiring line can be reduced.

For example, in the radio frequency module 1 according to the present embodiment, the acoustic wave filter 31 may be connected between the antenna connection terminal 100 and the radio frequency input terminal 111, and the plurality of passive components 3170, 3180, 4100, and 4200 may include an SMD (the passive component 4200) including the inductor 42 connected between a path between the acoustic wave filter 31 and the antenna connection terminal 100 and the ground.

According to this configuration, since the passive component 4200 includes the inductor 42 connected between the path between the acoustic wave filter 31 and the antenna connection terminal 100 and the ground, the wiring length between the inductor 42 and the acoustic wave filter 31 can be reduced and the mismatching loss due to the stray capacitance of the wiring line can be reduced.

Further, for example, in the radio frequency module 1 according to the present embodiment, the acoustic wave filter 31 may further include at least one of the inductor 317 and the capacitor 318 that are connected between at least one of the series arm resonators 311 to 313 and the ground, and the plurality of passive components 3170, 3180, 4100, and 4200 may include an SMD (the passive component 3170 and/or 3180) including at least one of the inductor 317 and the capacitor 318 of the acoustic wave filter 31.

According to this configuration, since the passive components 3170 and 3180 include the inductor 317 and the capacitor 318 that are connected between at least one of the series arm resonators 311 to 313 and the ground, the wiring length between the inductor 317 and the series arm resonator 311 and/or 312 and the wiring length between the capacitor 318 and the series arm resonator 312 and/or 313 can be reduced, and deterioration of characteristics of the acoustic wave filter 31 due to the stray capacitance of the wiring line can be suppressed.

For example, the radio frequency module 1 according to the present embodiment may further include a circuit component (for example, the switch component 5100) disposed on the main surface 9000a of the module substrate 9000, and at least a part of the circuit component may overlap at least a part of the filter component 3100 in the plan view of the module substrate 9000.

According to this configuration, the filter component 3100 is superimposed over the switch component 5100. Thus, an occupancy area of the filter component 3100 and the switch component 5100 on the main surface 9000a of the module substrate 9000 can be reduced, which can contribute to miniaturization of the radio frequency module 1.

In addition, for example, in the radio frequency module 1 according to the present embodiment, the filter component 3100 may include the plurality of terminals 3101 to 3106, the module substrate 9000 may include a metal member (for example, the post electrode 9011) disposed on the main surface 9000a of the module substrate 9000, and at least one of the plurality of terminals 3101 to 3106 of the filter component 3100 may be disposed on the metal member.

According to this configuration, the terminal 3106 of the filter component 3100 that is not disposed on the passive component is disposed on the post electrode 9011. Thus, the filter component 3100 can be more stably fixed to the module substrate 9000.

Further, for example, the radio frequency module 1 according to the present embodiment may further include the resin member 9200 covering at least a part of the plurality of passive components 3170, 3180, 4100, and 4200 and the filter component 3100, and the metal electrode layer 9300 covering at least a part of the surface of the resin member 9200, at least a part of the metal electrode layer 9300 may be physically connected to at least a part of the main surface 3100a of the filter component 3100, the main surface 3100a may be provided at an opposite side to the main surface 3100b of the filter component 3100, and the main surface 3100b may face the main surface 9000a of the module substrate 9000.

According to this configuration, since the main surface 3100a of the filter component 3100 is physically connected to the metal electrode layer 9300, heat dissipation of the filter component 3100 can be improved.

In addition, for example, the radio frequency module 1 according to the present embodiment may further include the filter component 3200 disposed over the passive component 4200 included in the plurality of passive components 3170, 3180, 4100, and 4200, the filter component 3200 including the series arm resonators 321 to 323 constituting the acoustic wave filter 32, the series arm resonator 322 being connected between the series arm resonators 321 and 323, and the region 3212s of the filter component 3200 formed with the series arm resonator 322 does not need to overlap the passive component 4200, and at least a part of the other region of the filter component 3200 may overlap at least a part of the passive component 4200 in the plan view of the module substrate 9000.

According to this configuration, since not only the filter component 3100 but also the filter component 3200 are disposed over the passive component 4200, it is possible to contribute to further miniaturization of the radio frequency module 1. Furthermore, in the plan view of the module substrate 9000, the region 3212s of the filter component 3200 formed with the series arm resonator 322 does not overlap the passive component 4200. Thus, deterioration of characteristics of the series arm resonator 322 due to a plurality of passive components 4200 can be suppressed, and deterioration of characteristics (for example, signal quality) of the radio frequency module 1 can be suppressed.

For example, in the radio frequency module 1 according to the present embodiment, each of the filter components 3100 and 3200 may include the plurality of terminals 3101 to 3106 or 3201 to 3206, the passive component 4200 may include the electrode 4201 electrically connected to at least one terminal 3102 among the plurality of terminals 3101 to 3106 of the filter component 3100 and the electrode 4202 electrically connected to at least one terminal 3206 among the plurality of terminals 3201 to 3206 of the filter component 3200, and at least a part of the electrode 4201 of the passive component 4200 may overlap at least a part of at least one terminal 3102 among the plurality of terminals 3101 to 3106 of the filter component 3100, and at least a part of the electrode 4202 of the passive component 4200 may overlap at least a part of at least one terminal 3206 among the plurality of terminals 3201 to 3206 of the filter component 3200 in the plan view of the module substrate 9000.

According to this configuration, since the electrode 4201 of the passive component 4200 electrically connected to the terminal 3102 of the filter component 3200 is superimposed with the terminal 3102, the wiring length between the filter component 3200 and the passive component 4200 can be shortened. Thus, the resistance loss due to the wiring line and/or the mismatching loss due to the stray capacitance of the wiring line can be reduced, and characteristics (for example, power efficiency) of the radio frequency module 1 can be improved.

Embodiment 2

Next, a second embodiment will be described. The present embodiment is mainly different from the first embodiment in that one of the plurality of passive components disposed below the filter component is disposed in a cavity formed in the module substrate. Hereinafter, the present embodiment will be described with reference to the drawings, focusing on differences from the first embodiment described above.

Note that a circuit configuration in a radio frequency module 1A according to the present embodiment is similar to that of the first embodiment described above, and thus, illustration and description thereof are omitted.

2.1 Implementation Example of Radio Frequency

Figure 9:
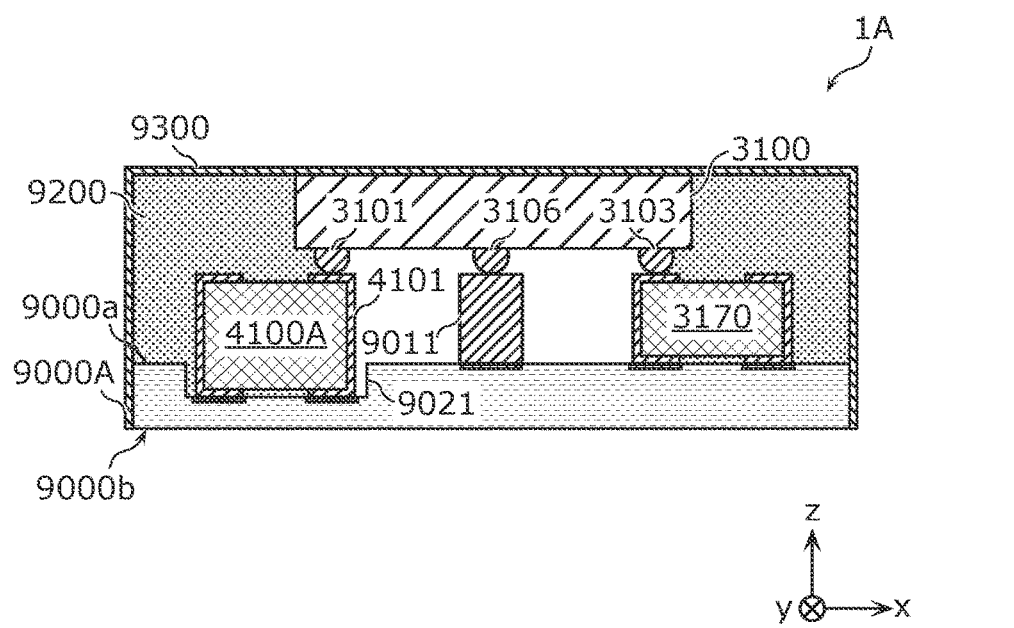
FIG. 9 is a cross-sectional view of a radio frequency module according to Embodiment 2.

An implementation example of the radio frequency module 1A according to the present embodiment will be described with reference to FIG. 9. FIG. 9 is a cross-sectional view of the radio frequency module 1A according to the present embodiment, and illustrates a cross section at a position similar to that in FIG. 5.

The radio frequency module 1A includes a module substrate 9000A and a passive component 4100A instead of the module substrate 9000 and the passive component 4100.

The module substrate 9000A is similar to the module substrate 9000 except that a main surface 9000a thereof is formed with a cavity 9021. Note that an outer peripheral edge of the cavity 9021 may be in contact with an outer peripheral edge of the module substrate 9000A. That is, the cavity 9021 may be a cutout portion cut out from the outer peripheral edge of the module substrate 9000A.

The passive component 4100A is an example of a first passive component, and is similar to the passive component 4100 except that a height of the passive component 4100A is higher than those of the other passive components (for example, the passive component 3170). The passive component 3170 is an example of a second passive component. At least a part of the passive component 4100A is disposed in the cavity 9021.

Note that although only one passive component 4100A is disposed in the cavity 9021 in the present embodiment, a plurality of passive components may be disposed in the cavity.

2.2 Effects and the Like

As described above, in the radio frequency module 1A according to the present embodiment, the cavity 9021 may be formed in the main surface 9000a of the module substrate 9000A, and at least a part of the passive component 4100A may be disposed in the cavity 9021.

According to this configuration, since at least a part of the passive component 4100A is disposed in the cavity 9021 of the module substrate 9000A, it is possible to contribute to a reduction in height of the radio frequency module 1A.

Further, for example, in the radio frequency module 1A according to the present embodiment, the passive component 3170 does not need to be disposed in the cavity 9021, and the height of the passive component 4100A may be larger than the height of the passive component 3170.

According to this configuration, at least a part of the passive component 4100A that is higher in height than the passive component 3170 is disposed in the cavity 9021 of the module substrate 9000A. Thus, the heights of the passive components 3170 and 4100A from the main surface 9000a of the module substrate 9000A can be made equal to each other, and the filter component 3100 can be more stably fixed over the passive components 3170 and 4100A.

Other Embodiments

Although the radio frequency module according to the present disclosure has been described above based on the embodiments and the examples, the radio frequency module according to the present disclosure is not limited to the embodiments and the examples described above. Other embodiments achieved by combining freely selected constituent elements in the above-described examples, modified examples obtained by applying various modifications conceived by a person skilled in the art to the above-described embodiments and examples without necessarily departing from the gist of the present disclosure, and various devices incorporating the above-described radio frequency module are also included in the present disclosure.

For example, in the circuit configuration of the radio frequency circuit according to each of the embodiments described above, another circuit element, wiring line, or the like may be inserted between paths connecting the circuit elements and the signal paths that are disclosed in the drawings. Additionally, as the impedance matching circuit, a capacitor may be used instead of or in addition to the inductor.

Note that although each of the acoustic wave filters 31 and 32 includes three series arm resonators and three parallel arm resonators in the embodiments described above, each of the number of series arm resonators and the number of parallel arm resonators that are included in each acoustic wave filter is not limited to three. For example, the acoustic wave filters 31 and/or 32 may include four or more series arm resonators or four or more parallel arm resonators. In addition, the acoustic wave filters 31 and/or 32 may include two or less parallel arm resonators or does not need to include a parallel arm resonator.

Note that the arrangement of the circuit components in each of the above-described embodiments is not limited to the arrangement disclosed in the drawings. For example, although each filter component is disposed over four passive components in each of the above-described embodiments, each filter component may be disposed over at least two passive components, and may be disposed over three or five or more passive components. Additionally, the switch component 5100 does not need to overlap the switch component 5100 in a plan view of the module substrate 9000. In this case, the switch component 5100 may be disposed on the main surface 9000b of the module substrate 9000.

Note that although the acoustic wave filter is used as a transmission filter in each of the above-described embodiments, the present disclosure is not limited thereto. The acoustic wave filter may be used as a reception filter or a transmission/reception filter. In this case, the communication device may include a low noise amplifier connected to the acoustic wave filter instead of or in addition to the power amplifier, and the radio frequency module may include a radio frequency output terminal connected to the low noise amplifier instead of or in addition to the radio frequency input terminal.

The features of the radio frequency module described based on each of the above-described embodiments will be described below.

<1> A radio frequency module comprising:
a module substrate;
a plurality of passive components disposed on a main surface of the module substrate; and
a first filter component disposed over the plurality of passive components,
wherein the first filter component includes a first series arm resonator, a second series arm resonator, and a third series arm resonator that constitute a first acoustic wave filter, and the second series arm resonator is connected between the first series arm resonator and the third series arm resonator, and
in a plan view of the module substrate, a region of the first filter component formed with the second series arm resonator does not overlap the plurality of passive components, and at least a part of another region of the first filter component overlaps at least a part of each of the plurality of passive components.

<2> The radio frequency module according to <1>,
wherein the first filter component includes a plurality of terminals,
at least one of the plurality of passive components includes an electrode electrically connected to at least one terminal among the plurality of terminals of the first filter component, and
at least a part of the electrode overlaps at least a part of the at least one terminal in the plan view of the module substrate.

<3> The radio frequency module according to <1> or <2>,
wherein each of the first series arm resonator, the second series arm resonator, and the third series arm resonator is a surface acoustic wave (SAW) resonator constituted by an interdigital transducer (IDT) electrode, and
the IDT electrode is disposed on a main surface of the first filter component facing the main surface of the module substrate.

<4> The radio frequency module according to any one of <1> to <3>,
wherein the first acoustic wave filter is connected between an antenna connection terminal and a radio frequency input terminal or a radio frequency output terminal, and
the plurality of passive components includes a surface mount device including at least one of an inductor and a capacitor that are connected between the first acoustic wave filter and the antenna connection terminal, the radio frequency input terminal, or the radio frequency output terminal.

<5> The radio frequency module according to any one of <1> to <4>,
wherein the first acoustic wave filter is connected between an antenna connection terminal and a radio frequency input terminal or a radio frequency output terminal, and
the plurality of passive components includes a surface mount device including at least one of an inductor and a capacitor that are connected between a ground and a path between the first acoustic wave filter and the antenna connection terminal, the radio frequency input terminal, or the radio frequency output terminal.

<6> The radio frequency module according to any one of <1> to <5>,
wherein the first acoustic wave filter further includes at least one of an inductor and a capacitor connected between a ground and at least one of the first series arm resonator, the second series arm resonator, and the third series arm resonator, and
the plurality of passive components includes a surface mount device including at least one of the inductor and the capacitor of the first acoustic wave filter.

<7> The radio frequency module according to any one of <1> to <6>, further comprising:
a circuit component disposed on the main surface of the module substrate,
wherein at least a part of the circuit component overlaps at least a part of the first filter component in the plan view of the module substrate.

<8> The radio frequency module according to any one of <1> to <7>,
wherein the first filter component includes a plurality of terminals,
the module substrate includes a metal member disposed on the main surface of the module substrate, and
at least one of the plurality of terminals of the first filter component is disposed on the metal member.

<9> The radio frequency module according to any one of <1> to <8>, further comprising:
a resin member covering at least a part of the plurality of passive components and the first filter component; and
a metal electrode layer covering at least a part of a surface of the resin member,
wherein at least a part of the metal electrode layer is physically connected to at least a part of a first main surface of the first filter component, the first main surface being provided at an opposite side to a second main surface of the first filter component, the second main surface facing the main surface of the module substrate.

<10> The radio frequency module according to any one of <1> to <9>, further comprising:
a second filter component disposed over at least one passive component included in the plurality of passive components, the second filter component including a fourth series arm resonator, a fifth series arm resonator, and a sixth series arm resonator that constitute a second acoustic wave filter, the fifth series arm resonator being connected between the fourth series arm resonator and the sixth series arm resonator,
wherein in the plan view of the module substrate, a region of the second filter component provided with the fifth series arm resonator does not overlap the at least one passive component, and at least a part of another region of the second filter component overlaps at least a part of the at least one passive component.

<11> The radio frequency module according to <10>,
wherein each of the first filter component and the second filter component includes a plurality of terminals,
the at least one passive component includes
a first electrode electrically connected to at least one terminal among the plurality of terminals of the first filter component, and
a second electrode electrically connected to at least one terminal among the plurality of terminals of the second filter component, and
in the plan view of the module substrate,
at least a part of the first electrode of the at least one passive component overlaps at least a part of at least one terminal among the plurality of terminals of the first filter component, and at least a part of the second electrode of the at least one passive component overlaps at least a part of at least one terminal among the plurality of terminals of the second filter component.

<12> The radio frequency module according to any one of <1> to <11>,
wherein a cavity is formed in the main surface of the module substrate, and
at least a part of a first passive component included in the plurality of passive components is disposed in the cavity.

<13> The radio frequency module according to <12>,
wherein a second passive component included in the plurality of passive components is not disposed in the cavity, and
a height of the first passive component is larger than a height of the second passive component.

The present disclosure can be widely used in communication devices such as mobile phones as a radio frequency module to be disposed in a front end unit.

What is claimed is:

1. A radio frequency module comprising:
a module substrate;
a plurality of passive circuit components on a main surface of the module substrate;
a first filter circuit component above the plurality of passive circuit components;
a resin covering at least a part of the plurality of passive circuit components and the first filter circuit component; and
a metal electrode layer covering at least a part of a surface of the resin,
wherein the first filter circuit component comprises a first acoustic wave filter, the first acoustic wave filter comprising a first series arm resonator, a second series arm resonator, and a third series arm resonator, the second series arm resonator being connected between the first series arm resonator and the third series arm resonator,
wherein in a plan view of the module substrate, the second series arm resonator does not overlap the plurality of passive circuit components, and a region of the first filter circuit component not comprising the second series arm resonator overlaps at least a part of each of the plurality of passive circuit components, and
wherein at least a part of the metal electrode layer is physically connected to at least a part of a first main surface of the first filter circuit component, the first main surface being at an opposite side to a second main surface of the first filter circuit component, the second main surface facing the main surface of the module substrate.

2. The radio frequency module according to claim 1,
wherein the first filter circuit component comprises a plurality of terminals,
wherein at least one of the plurality of passive circuit components comprises an electrode electrically connected to at least one of the plurality of terminals of the first filter circuit component, and
wherein at least a part of the electrode overlaps at least a part of the at least one terminal in the plan view of the module substrate.

3. The radio frequency module according to claim 1,
wherein each of the first series arm resonator, the second series arm resonator, and the third series arm resonator is a surface acoustic wave (SAW) resonator comprising an interdigital transducer (IDT) electrode, and
wherein the IDT electrode is on a main surface of the first filter circuit component facing the main surface of the module substrate.

4. The radio frequency module according to claim 1,
wherein the first acoustic wave filter is connected between an antenna connection terminal and a radio frequency input terminal or a radio frequency output terminal,
wherein the plurality of passive circuit components comprises at least one surface mount device, and
wherein the at least one surface mount device comprises an inductor or a capacitor that is connected between the first acoustic wave filter and the antenna connection terminal, the radio frequency input terminal, or the radio frequency output terminal.

5. The radio frequency module according to claim 1,
wherein the first acoustic wave filter is connected between an antenna connection terminal and a radio frequency input terminal or a radio frequency output terminal, and
the plurality of passive circuit components comprises a surface mount device comprising an inductor or a capacitor that is connected between ground and a path between the first acoustic wave filter and the antenna connection terminal, the radio frequency input terminal, or the radio frequency output terminal.

6. The radio frequency module according to claim 1,
wherein the first acoustic wave filter further comprises an inductor or a capacitor connected between ground and the first series arm resonator, the second series arm resonator, or the third series arm resonator, and
the plurality of passive circuit components comprises a surface mount device comprising the inductor or the capacitor of the first acoustic wave filter.

7. The radio frequency module according to claim 1, further comprising:
a circuit component on the main surface of the module substrate,
wherein at least a part of the circuit component overlaps at least a part of the first filter circuit component in the plan view of the module substrate.

8. The radio frequency module according to claim 1,
wherein the first filter circuit component comprises a plurality of terminals,
the module substrate comprises a metal member on the main surface of the module substrate, and
at least one of the plurality of terminals of the first filter circuit component is on the metal member.

9. The radio frequency module according to claim 2,
wherein the module substrate comprises a metal member on the main surface of the module substrate, and
at least one of the plurality of terminals of the first filter circuit component is on the metal member.

10. The radio frequency module according to claim 1, further comprising:
a second filter circuit component above at least one of the plurality of passive circuit components, the second filter circuit component comprising a second acoustic wave filter, the second acoustic wave filter comprising a fourth series arm resonator, a fifth series arm resonator, and a sixth series arm resonator, the fifth series arm resonator being connected between the fourth series arm resonator and the sixth series arm resonator,
wherein in the plan view of the module substrate, the fifth series arm resonator does not overlap the at least one passive circuit component, and at least a part of a region of the second filter circuit not comprising the fifth series arm resonator overlaps at least a part of the at least one passive circuit component.

11. The radio frequency module according to claim 10,
wherein each of the first filter circuit component and the second filter circuit component comprises a plurality of terminals,
wherein the at least one passive circuit component comprises:
a first electrode electrically connected to at least one of the plurality of terminals of the first filter circuit component, and
a second electrode electrically connected to at least one of the plurality of terminals of the second filter circuit component, and
wherein in the plan view of the module substrate:
at least a part of the first electrode of the at least one passive circuit component overlaps at least a part of the at least of the plurality of terminals of the first filter circuit component, and
at least a part of the second electrode of the at least one passive circuit component overlaps at least a part of the at least one of the plurality of terminals of the second filter circuit component.

12. The radio frequency module according to claim 2, further comprising:
a second filter circuit component above at least one of the plurality of passive circuit components, the second filter circuit component comprising a second acoustic wave filter, the second acoustic wave filter comprising a fourth series arm resonator, a fifth series arm resonator, and a sixth series arm resonator, the fifth series arm resonator being connected between the fourth series arm resonator and the sixth series arm resonator,
wherein in the plan view of the module substrate, the fifth series arm resonator does not overlap the at least one passive circuit component, and at least a part of a region of the second filter circuit component not comprising the fifth series arm resonator overlaps at least a part of the at least one passive circuit component.

13. The radio frequency module according to claim 12,
wherein the second filter circuit component comprises a plurality of terminals,
wherein the at least one passive circuit component comprises:
a first electrode electrically connected to at least one of the plurality of terminals of the first filter circuit component, and
a second electrode electrically connected to at least one of the plurality of terminals of the second filter circuit component, and
wherein in the plan view of the module substrate:
at least a part of the first electrode of the at least one passive circuit component overlaps at least a part of at least one of the plurality of terminals of the first filter circuit component, and
at least a part of the second electrode of the at least one passive circuit component overlaps at least a part of at least one of the plurality of terminals of the second filter circuit component.

14. The radio frequency module according to claim 1,
wherein the main surface of the module substrate comprises a cavity, and
wherein at least a part of a first of the plurality of passive circuit components is in the cavity.

15. The radio frequency module according to claim 14,
wherein a second of the plurality of passive circuit components is not in the cavity, and
wherein a height of the first passive circuit component is larger than a height of the second passive circuit component.

* * * * *